(12) United States Patent
Razon et al.

(10) Patent No.: US 6,386,433 B1
(45) Date of Patent: May 14, 2002

(54) SOLDER BALL DELIVERY AND REFLOW APPARATUS AND METHOD

(75) Inventors: Eli Razon, Maple Glen; Vaughn Svendsen, Ambler; Robert Kowtko, Warrington; Kyle Dury, Newtown; Krishnan Suresh, Willow Grove, all of PA (US)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 0 days.

(21) Appl. No.: 09/636,667

(22) Filed: Aug. 11, 2000

Related U.S. Application Data

(63) Continuation-in-part of application No. 09/382,228, filed on Aug. 24, 1999, now Pat. No. 6,227,437.

(51) Int. Cl.⁷ .................................................. B23K 1/20
(52) U.S. Cl. ........................... 228/246; 228/13; 228/14
(58) Field of Search ........................... 228/254, 13, 14, 228/244, 248.1, 246; 222/547; 221/150 R, 267, 268, 269, 270, 278

(56) References Cited

U.S. PATENT DOCUMENTS

| | | |
|---|---|---|
| 3,526,743 A | 9/1970 | Spisak |
| 4,101,284 A | 7/1978 | Difiglio et al. |
| 4,442,967 A | 4/1984 | van de Pas et al. |
| 4,767,047 A | 8/1988 | Todd et al. |
| 4,871,110 A | 10/1989 | Fukasawa et al. |
| 5,014,111 A | 5/1991 | Tsuda et al. |
| 5,193,738 A | 3/1993 | Hayes |
| 5,284,287 A | 2/1994 | Wilson et al. |
| 5,320,273 A | 6/1994 | Goenka et al. |
| 5,415,321 A | 5/1995 | Gehlert et al. |
| 5,421,504 A | 6/1995 | Spirig |
| 5,425,493 A | 6/1995 | Interrante et al. |
| 5,431,332 A | 7/1995 | Kirby et al. |
| 5,445,313 A | 8/1995 | Boyd et al. |
| 5,467,913 A | 11/1995 | Namekawa et al. |
| 5,484,979 A | 1/1996 | Gao |
| 5,506,385 A | 4/1996 | Murakami et al. |
| 5,540,377 A | 7/1996 | Ito |
| 5,565,119 A | 10/1996 | Behun et al. |
| 5,601,229 A | 2/1997 | Nakazato et al. |
| 5,653,381 A | 8/1997 | Azdasht |
| 5,655,704 A | 8/1997 | Sakemi et al. |
| 5,695,667 A | 12/1997 | Eguchi et al. |
| 5,768,775 A | 6/1998 | Nakazato |
| 5,828,031 A | 10/1998 | Pattanaik |
| 5,829,632 A | 11/1998 | Gehlert et al. |
| 5,839,641 A | 11/1998 | Teng |
| 5,857,610 A | 1/1999 | Hoshiba et al. |
| 5,878,911 A | 3/1999 | Lin et al. |
| 5,897,049 A | 4/1999 | Nakamura et al. |
| 5,899,737 A | 5/1999 | Trabucco |
| 5,917,156 A | 6/1999 | Nobori et al. |
| 5,918,792 A | 7/1999 | Stumpe et al. |
| 5,921,458 A | 7/1999 | Fan |
| 5,977,512 A | 11/1999 | Azdasht et al. |
| 5,981,371 A | 11/1999 | Yamazaki et al. |
| 6,003,753 A | 12/1999 | Hwang et al. |
| 6,053,398 A | 4/2000 | Iizuka et al. |
| 6,056,190 A | 5/2000 | Foulke et al. |

FOREIGN PATENT DOCUMENTS

| | | |
|---|---|---|
| WO | WO 97/20654 | 6/1997 |

*Primary Examiner*—Tom Dunn
*Assistant Examiner*—Colleen P. Cooke
(74) *Attorney, Agent, or Firm*—Ratner & Prestia

(57) ABSTRACT

An apparatus and method for high speed, reliable and repeatable delivery and reflow of solder material onto a substrate are disclosed. The apparatus has a repositionable capillary to direct individual solder material to a specific location on the substrate. An energy source is directed through the capillary onto the solder to reflow the solder to the substrate. The apparatus provides for individual introduction of the solder material into the capillary and urging of the solder material from a reservoir to the capillary while preventing unintended jams and blockage of the solder material.

35 Claims, 18 Drawing Sheets

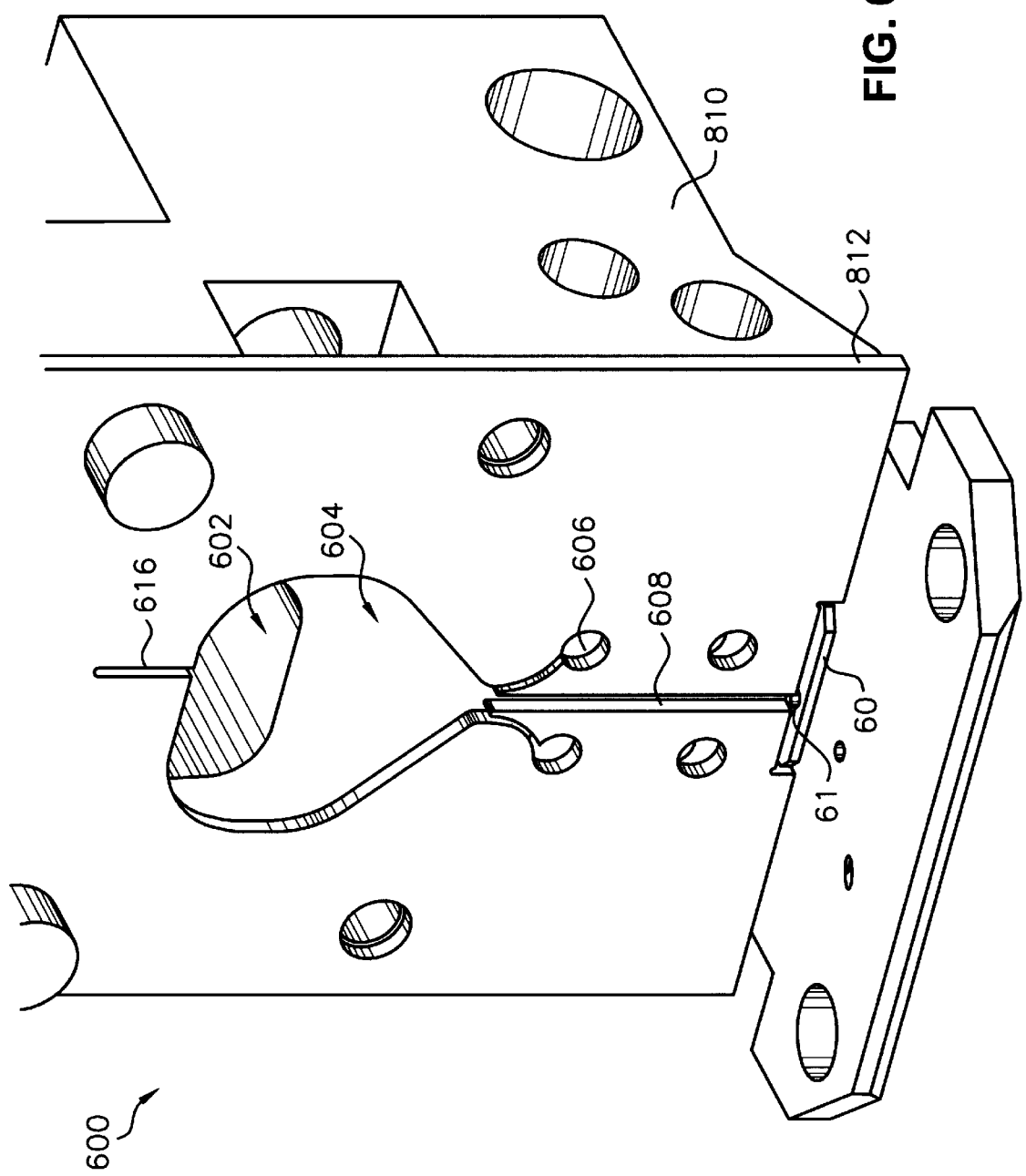

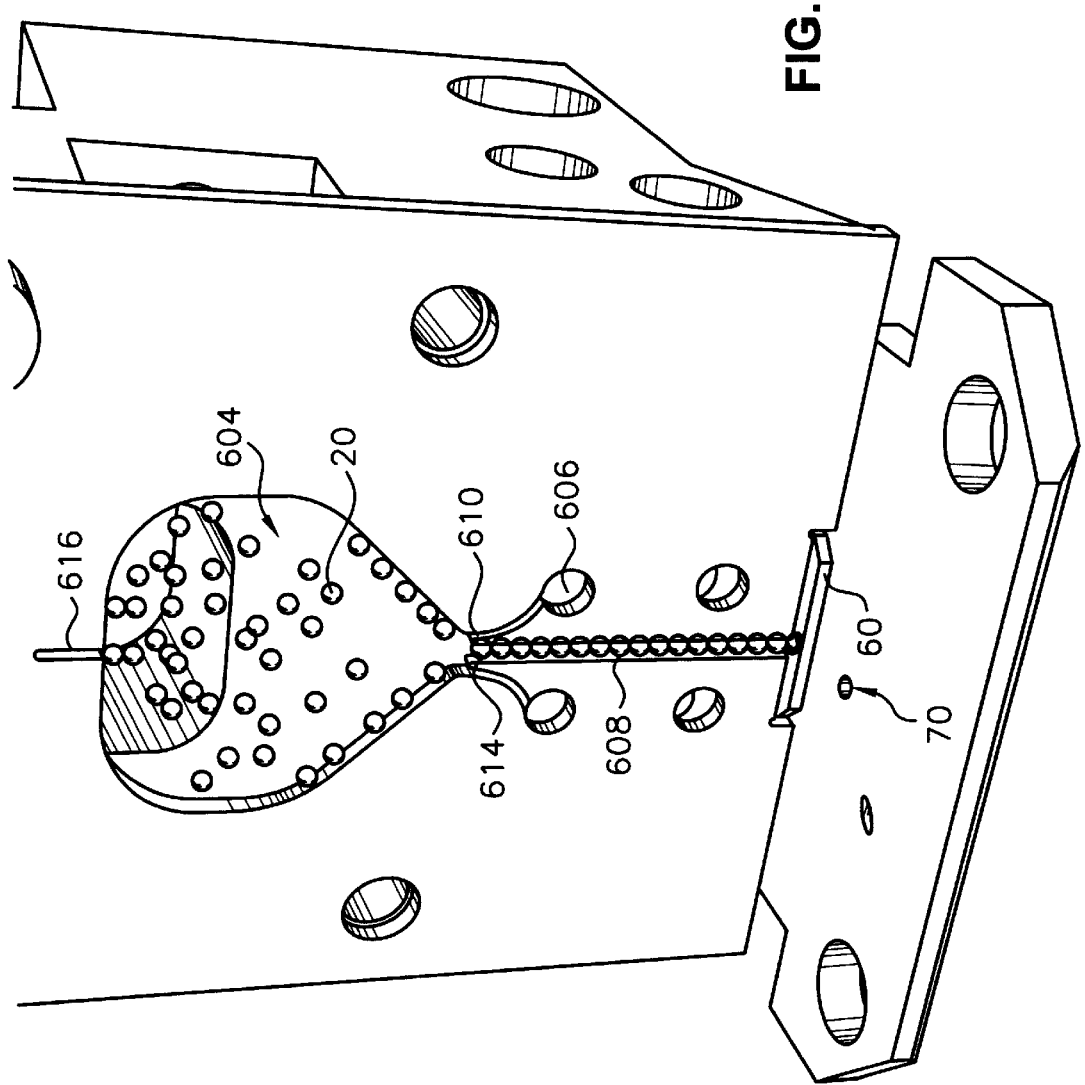

SOLDER BALL DELIVERY AND REFLOW APPARATUS AND METHOD

This application is a continuation-in-part of U.S. patent application Ser. No. 09/382,228, filed on Aug. 24, 1999 now U.S. Pat. No. 6,227,437.

BACKGROUND OF THE INVENTION

This invention generally relates to the placement and reflow of solder balls on substrates used in the electronics field. More particularly, the present invention relates to an improved apparatus and method for the high speed placement and reflow of solder balls using a high energy laser and an inert gas to ensure repeatable, precise placement and reflow at rates exceeding 40 balls per second.

DESCRIPTION OF THE RELATED ART

With the increased demand for high speed and miniaturized electronics, the need to reliably and repeatably produce integrated circuit (IC) substrates and substrates used for semiconductors has also grown. Such electronic components include plastic ball grid arrays ("PBGA"), chip scale packages ("CSP"), and direct chip attach ("DCA") components. One important step in the manufacture of such substrates is the placement of solder connection points in specific locations on the substrate.

With the expanding general demand for substrates, there has also been a continuing reduction in size of electronic components and an increase in the number of circuits, and therefore electrical connection points required on each substrate. As such, the number of and density of solder connection points on substrates has substantially increased. As compared to substrates manufactured several years ago, today's substrates used for IC chips or semiconductors has substantially more and higher density solder connection points. It is expected that such miniaturization of substrates and an increase in the required solder connection points will continue into the future.

As demands of higher speed and more sophisticated electronic devices has expanded, the respective demands for precise placement and reflow of solder material onto substrates used in manufacturing the devices has likewise grown. Attempting to keep pace with these demands, the technology of delivery and reflow of solder material has also been developing.

Representative prior art includes U.S. Pat. No. 5,467,913 issued to Namekawa et al. for a Solder Ball Supply Device. The Namekawa et al. device uses a discharger with a matrix of solder ball holding cavities, a head section having a number of air suction holes, and a solder ball supply means to take out, at one time, a large number of solder balls from the holding cavities and to place them, at one time, onto a substrate board. While this device may be able to place a number of solder connection points onto a substrate at one time, the device does not allow for easy alteration or modification of the patterns or matrices of solder connection points.

A different method of placing and bonding solder to a bonding surface is shown by the apparatus and process disclosed in U.S. Pat. No. 5,653,381 issued to Azdasht for a Process And Apparatus For Producing A Bonded Metal Coating. The Azdasht device uses specific solder material that may be transported within a capillary to a bonding surface by a physical stamp guided within the capillary. The physical stamp may also be an energy transfer device used to bond the solder material to the surface after it is "stamped" into place. While the "one at a time" placement and bonding of the solder appears to allow for easy reconfiguration of solder connection patterns between substrates, the device and method do not appear to be suitable for the high speed bonding required for mass production of substrates. Indeed, the Azdasht U.S. patent provides that an object of the device is for "pilot or same-scale production" runs. PCT application WO 97/20654, for a Process And Device For Applying A Solder To A Substrate Or Chip Without Flux, also having as its inventor Ghassem Azdasht, is a German application. The Abstract, in English, describes a process and device to clean a region on a substrate and remelt solder to the substrate.

Devices similar to that described in the Azdasht U.S. patent are available from PAC TECH, Packaging Technologies GmbH. Such "solder ball bumper bondhead" machines are limited to ball placement and bonding rates of approximately 2 balls per second. As noted, with the reduction in the size of IC chips and semiconductors, and the circuits contained therein, and with the increase in the number of solder connections required to be on each substrate, there is a need for increased production speeds to place and bond or reflow solder balls to a substrate.

Accordingly, there remains a need for reliable and repeatable high speed delivery and reflow of solder connection points, or solder balls, onto substrates. Such reliability and repeatability is necessary for mass production of IC chips and semiconductors. Moreover, there is a need for such high speed delivery and reflow of solder balls with the flexibility of easy reconfiguration of the solder connection point patterns between different substrates.

SUMMARY OF THE INVENTION

In view of the shortcomings of the prior art, it is an object of the present invention to improve the speed, reliability and repeatability of delivering and reflowing solder material to a substrate. It is a further object of the present invention that the apparatus and method provide high speed capability of delivery and reflow of solder material necessary for mass production of substrates. Yet another object of the present invention is to permit easy and flexible modification of the solder material pattern on a substrate through use of a computer processor.

In a preferred embodiment, the present invention is an apparatus for delivering and reflowing solder material onto a substrate, comprising a stationary reservoir to hold the solder material; a capillary for guiding the solder material to the substrate; a flexible feed tube coupled to the reservoir for directing the solder material from the reservoir to the capillary; indexing means coupled to the feed tube and the capillary to individually index the solder material from the feed tube into the capillary; deliver means to deliver the solder material from the reservoir, through (a) the feed tube, (b) the indexing means, (c) the capillary and onto the substrate; and an energy source coupled to the capillary to reflow the solder material onto the substrate. In one preferred embodiment, the energy source is a laser.

According to another aspect of the invention, the delivery means comprises a pressurized fluid introduced into the reservoir to urge the solder material through the feed tube, through the indexing means, through the capillary and onto the substrate. The pressurized fluid, in preferred embodiments may be an inert gas, such as nitrogen.

According to still another aspect of the invention, the feed tube comprises a first tube and a second tube within the first tube, such that the second tube is substantially centered within the first tube, the second tube being for delivery of the solder material from the reservoir and the first tube for delivery of the pressurized fluid into the reservoir.

According to yet another aspect of the present invention, the reservoir incorporates sensing means to monitor the level of solder material in the reservoir.

According to a further aspect of the present invention, the indexing means individually indexes solder balls at a speed of about 200 solder balls per second.

According to yet another aspect of the present invention, the delivery and reflow of the solder balls is approximately 40 balls each second.

According to still another aspect of the present invention, the energy source includes a sensor to monitor the energy level delivered by the energy source.

According to another aspect of the present invention, a method of delivering and reflowing solder material onto a substrate, the method comprising the steps of: (a) urging solder material held in a stationary reservoir through a flexible feed tube by a pressurized fluid; (b) individually indexing the solder material from the feed tube into a capillary; (c) directing the individual solder material through the capillary to the substrate; and (d) reflowing the individual solder material to the substrate with an energy source.

These and other aspects of the present invention are set forth below with reference to the drawings and the detailed description of certain preferred embodiments.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures:

FIGS. 6A–6C are perspective cutaway views of a third exemplary embodiment of the present invention;

DETAILED DESCRIPTION

The present invention is an improved apparatus and method for delivering and reflowing solder material onto substrates that are used in the manufacture of IC chips, semiconductor devices, or other miniaturized electronic circuits.

The improvements of the present invention increase the speed of delivery and reflow of the solder onto a substrate in a highly reliable and repeatable process. As noted above, with the increased number of solder connections required on electrical circuit substrates, the repeatable and precise placement of all solder connections is critical to the success of a production method and apparatus. For example, if the last solder ball on a substrate containing hundreds of connection points is misplaced or misformed, the entire substrate may be unusable. Accordingly, a high degree of reliability and repeatability is required and is achieved with the improvements of the present invention.

Although the solder material are generally described herein as solder balls, it is to be understood that the solder material may be in shapes other than spherical. The scope and spirit of the present invention is not limited to spherical shaped solder material, but is intended to encompass other shapes as well.

Figure 1:
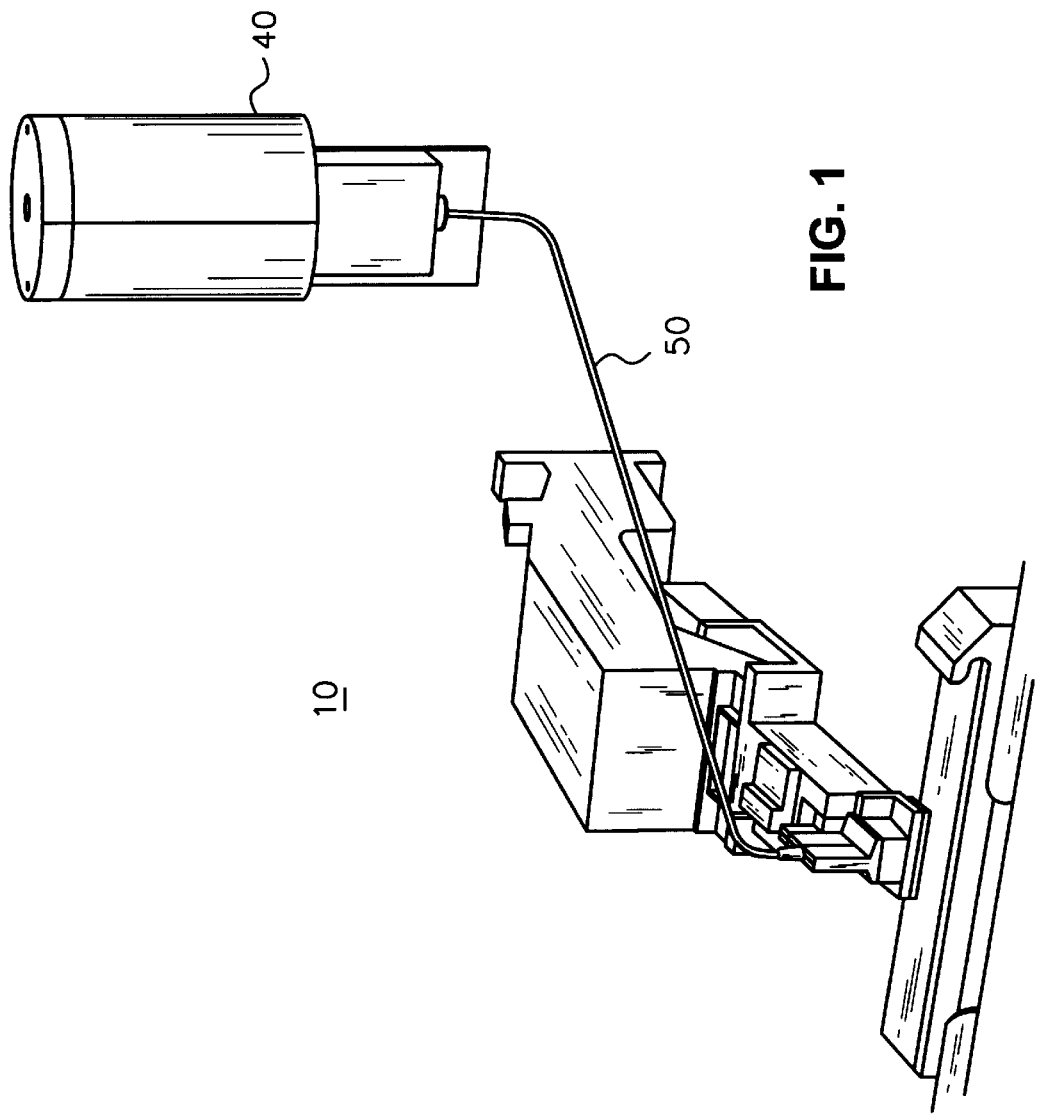
FIG. 1 is a schematic view of an exemplary embodiment of the present solder delivery and reflow invention.

In an exemplary embodiment of the present invention, the delivery and reflow apparatus, as illustrated in FIG. 1, has a translatable capillary for guiding solder material onto a substrate. The capillary is capable of translating in three degrees of freedom, being the x, y and z directions. For reference, the x and y directions are within the plane of the substrate, while the z-direction is perpendicular to the plane of the substrate.

Proceeding upstream from the substrate, the solder material is individually indexed into the capillary where the solder is guided onto the substrate. The solder material is delivered to the indexing component by a feed tube connected to a reservoir. The reservoir 40 maintains a supply of solder material to be individually reflowed to the substrate. After the solder material is delivered onto the substrate by the positioning of the capillary, an energy source is used to reflow the solder onto the substrate. The capillary is then repositioned to the next location over the substrate to deliver and reflow the next solder material. Because high-speed delivery, placement and reflow of the solder balls is an objective of the present invention, the speed of moving the capillary is an important aspect. As such, the capillary is designed to be lightweight. Moreover, the components of the present invention that are translated with the capillary are intended to be minimized. In that regard, the solder ball reservoir is, in a preferred embodiment, separated from the capillary and is stationary.

Figure 2:
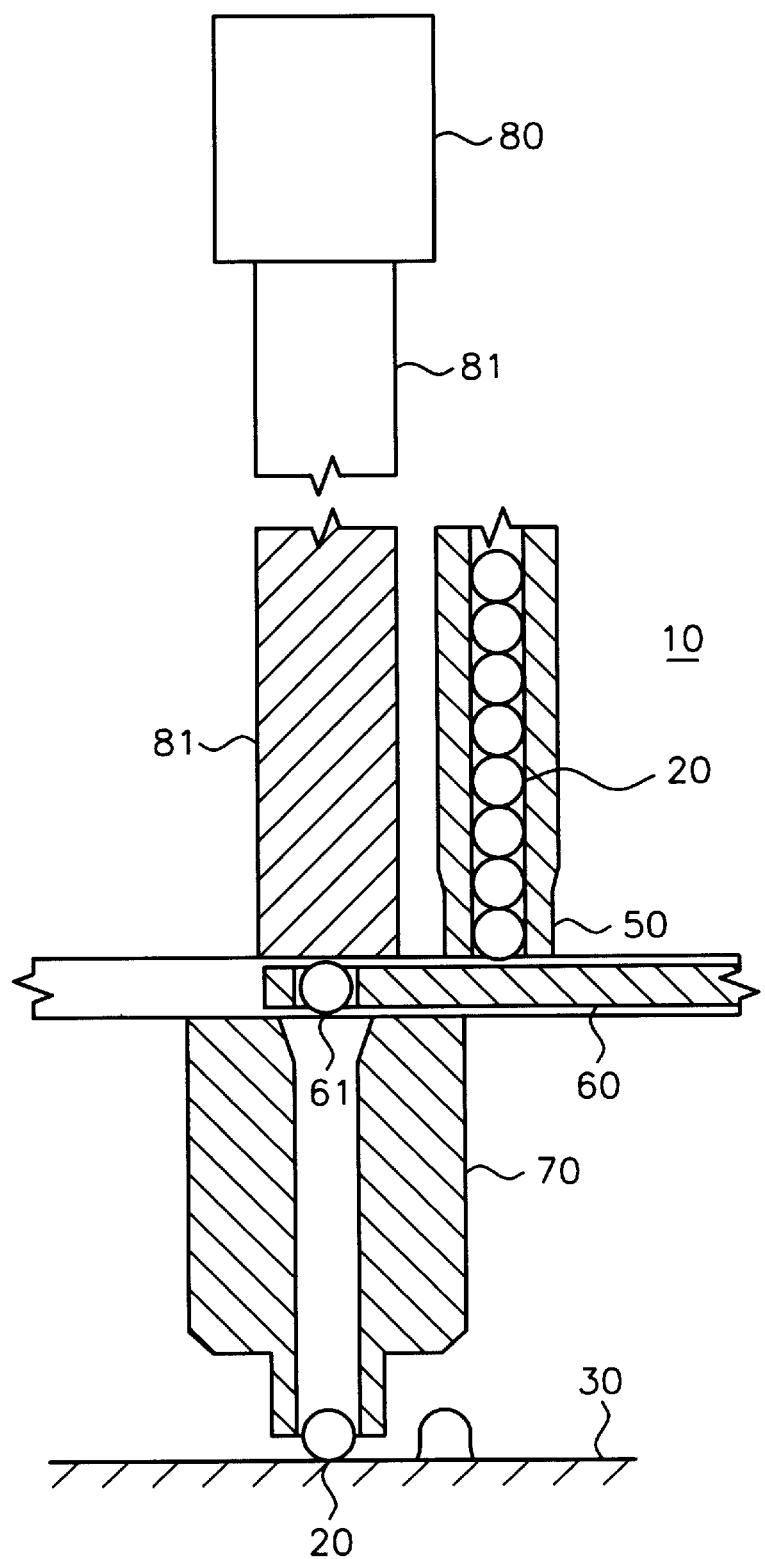
FIG. 2 is an illustrated cutaway side view of an exemplary embodiment of a feed head of the present invention.

In further detail, a preferred embodiment of the delivery and reflow apparatus 10 is shown in the FIG. 2 cutaway view of a capillary 70, laser 80 and fiber optic 81 located directly above and centered over the capillary 70, an indexing slide 60 coupled to the capillary 70, and a portion of a feed tube 50 coupled to the indexing slide 60.

As illustrated in FIG. 2, the capillary 70 is positioned directly above the substrate 30 and above the position on the substrate 30 where the solder ball 20 is to be reflowed. In operation, the capillary 70 guides each individual solder ball 20 to the position on the substrate 30 where the solder ball 20 is desired to be reflow.

Each solder ball 20 is indexed to the top of the capillary 70 by an indexing means 60. In one preferred embodiment, as shown in FIG. 2, the indexing means may be a slide mechanism 60. The slide mechanism 60 individually indexes a solder ball 20 from the feed tube 50 to the top of the capillary 70 by a orifice 61 cut into the slide 60. When the indexing slide 60 is translated to the right, as shown in FIG. 2(b), orifice 61 is directly below the feed tube 50, and one solder ball moves into the slide orifice 61. When the indexing slide 60 is then translated to the left to a position where the slide orifice 61 is directly over the top of the capillary 70, as shown in FIG. 2(b), the solder ball 20 in the slide orifice 61 is released and is guided down the capillary 70 onto the substrate 30.

In a preferred embodiment, capillary 70 may be approximately ten solder ball diameters in length. While capillaries with a length in excess of ten solder ball diameters may be effectively used, if the length of the capillary is substantially more than ten solder ball diameters the energy of the laser incident on the solder ball 20 may be reduced such that the reflow of solder ball 20 is negatively affected, thereby reducing the overall throughput of the device. With an increase in time for the solder ball to be placed on the substrate 30, the ultimate speed of delivery and reflow of the solder could be detrimentally affected.

As shown in the FIG. 2 exemplary embodiment, the capillary interior diameter may be approximately the same dimension as the diameter of the solder balls being placed and reflowed to the substrate 30. Although for a given size capillary, smaller diameter solder balls may also be used, such solder balls may have a tendency to deflect and bounce off the capillary side walls and may not be precisely placed in the center of the capillary when finally set on the substrate prior to being reflowed.

Figure 3:
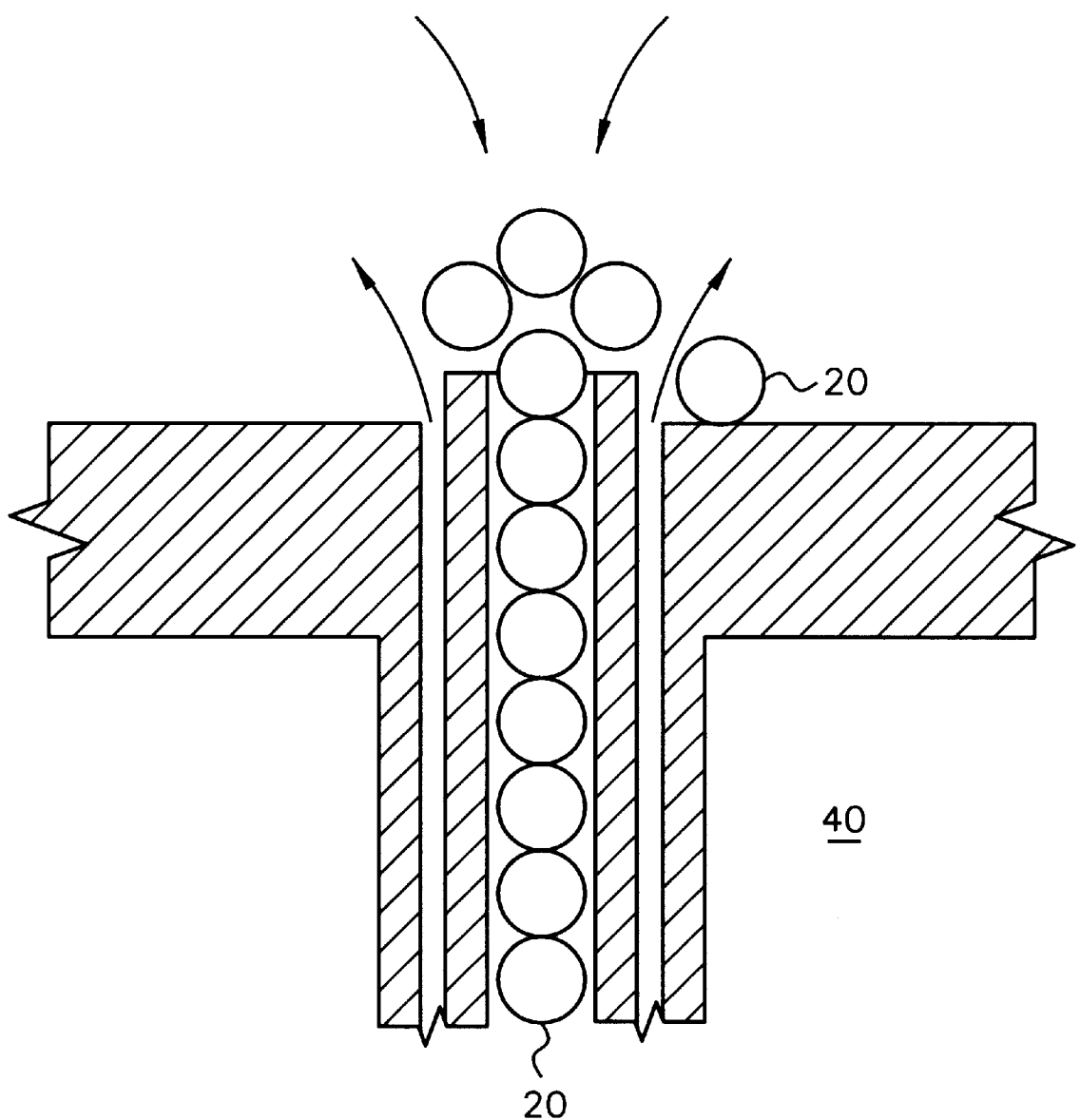
FIG. 3 is an illustrated cutaway side view of an exemplary embodiment of a reservoir used in the present invention.

The exterior diameter of the capillary at the end in proximity to the substrate 30, as shown in FIG. 2 and FIG. 3, may approximately be, in a preferred embodiment, two solder ball diameters. By making the exterior diameter of the capillary narrow, the solder balls may be effectively positioned in close proximity to each other, or in close proximity to other components previously attached to the substrate 30. In another exemplary embodiment, where the capillary end is not narrow, the capillary diameter could be the limiting dimension determining how close adjacent solder balls could be placed to each other. Similarly, if a wide capillary end were used, the width would determine how close a solder connection point could be place to a component previously attached to the substrate 30. With space on a substrate being a premium, and with the required density of solder connection points increasing, the ability to closely place solder balls is an important feature of the present invention.

As such, in a preferred embodiment of the present invention, to best ensure correct deliver and positioning of the solder balls onto the substrate 30, where different diameter solder balls are used, a different capillary having an interior diameter that is similar to the solder balls being reflowed could be used.

In another preferred embodiment, the solder ball 20 may be urged down the capillary 70 and held in place on the substrate 30 by a pressurized fluid flowing coaxially with the laser fiber optic 81 and through the capillary 70. The use of pressurized fluid to push the solder material 20 onto the substrate 30 tends to reduce the time for the solder ball 20 to be properly placed on the substrate surface by reducing solder ball bounce. The pressure of the fluid need only be in the approximate range of one atmosphere. By using an inert gas, such as nitrogen, as the pressurized fluid, the solder balls may also be maintained in a nonoxidizing environment while in the capillary 70 and prior to and during reflow of the solder ball 20 to the substrate 30. Because solder material is typically an alloy composed of tin and lead, the solder has a tendency to quickly oxidize in an open air environment. Maintaining the solder in a non-oxidizing environment prevents undesired oxidation which could impede proper reflow of the solder to the substrate 30.

The delivery of the solder balls from the reservoir 40 through the feed tube 50 and into the capillary 70 provides a multitude of junction points where the solder balls 20 may jam or clog. This is particularly the case at the exit location of the reservoir 40 into which the feed tube 50 is coupled. In a preferred embodiment of the present invention, a positive pressure fluid may be introduced into the reservoir 40 to urge the solder balls into and through the feed tube 50, and finally into the indexing means 60.

Figure 4:
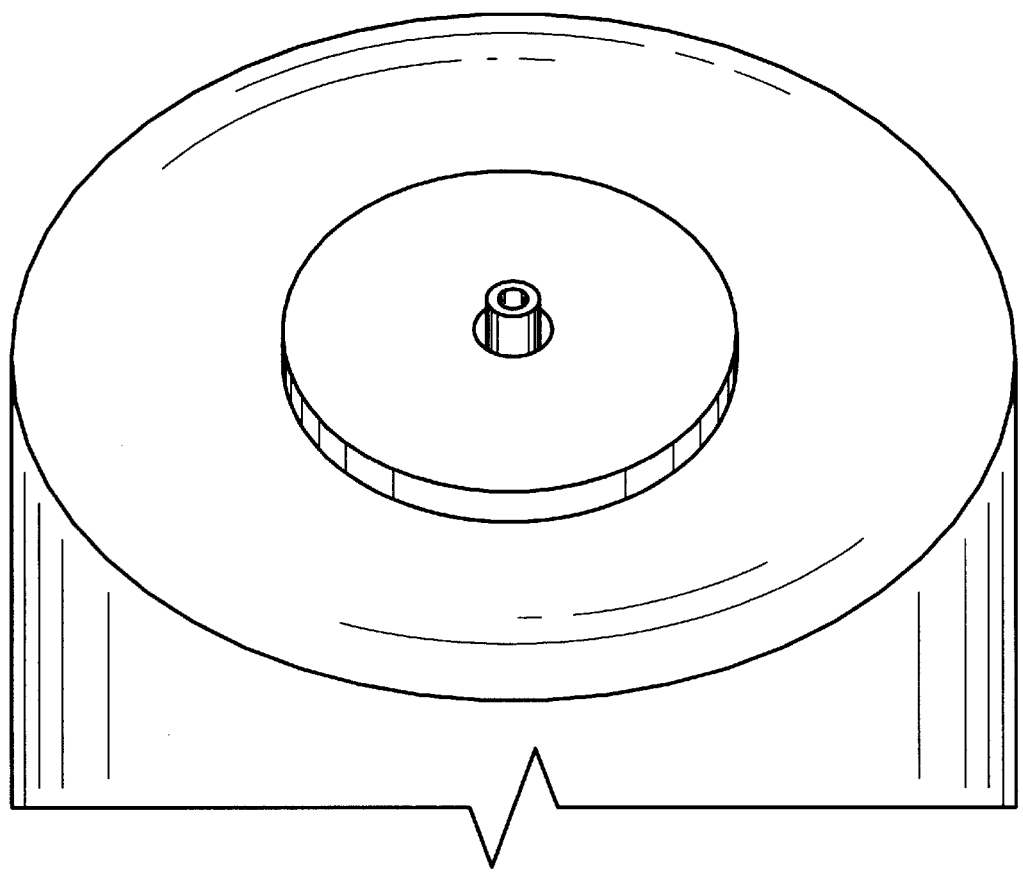
FIG. 4 is a cutaway interior view of an exemplary embodiment of a reservoir used in the present invention.

While direct introduction of a pressurized fluid into the reservoir 40 tends to urge the solder balls into the feed tube 50, it has been found that significant improvement in reducing solder material jams can be achieved if, as shown in FIG. 3 and FIG. 4, the pressurized fluid is introduced into the reservoir 40 coaxial with the feed tube exit location. It is believed that the pressurized fluid flow into the reservoir 40 prevents the solder balls from coagulating at the feed tube entrance and forms fluid currents that draw solder balls into the feed tube 50 without jams. One exemplary embodiment of this coaxial introduction of a pressurized fluid is by using coaxial tubes, as illustrated in FIG. 3, such that the internal tube is used to guide and deliver the solder balls to the indexing means, while the space formed by the annulus between the internal tube and the external tube is used to carry the pressurized fluid into the reservoir 40.

In addition to preventing jamming of the solder balls in the reservoir 40 and through the feed tube 50, as described above, in another preferred embodiment, the pressurized fluid may be an inert gas, such as nitrogen. Through the use of an inert gas, the environment that the solder balls are exposed to from the reservoir 40 all the way to the substrate 30 is nonoxidizing. As explained above, the solder balls have a tendency to quickly oxidize in an open air environment. Indeed, the vibration of the solder balls causing them to collide with each other accelerates surface oxidation and causes the solder balls to discolor. Such surface oxidation may prevent proper reflow of the solder ball 20 to the substrate 30 and could reduce the quality of the final product to be used in construction of IC chips and semiconductors.

Figure 5:
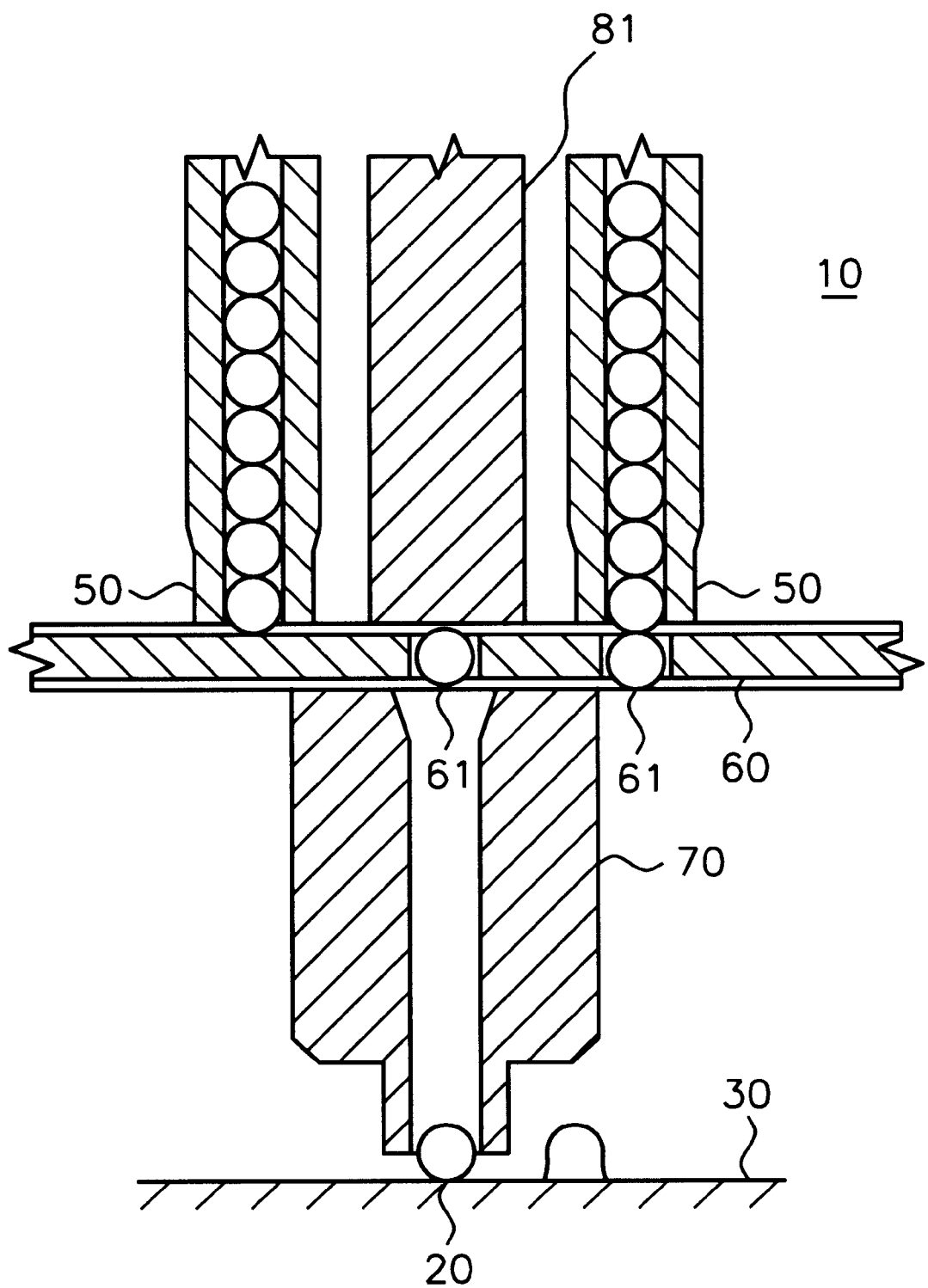
FIG. 5 is an illustrated cutaway side view of a second exemplary embodiment of the present invention.

As shown in FIG. 5, in another preferred embodiment of the present inventive apparatus 10, the indexing slide 60 may be configured as a bi-directional slide. In this configuration, two feed tubes 50 would be used to deliver solder balls to the capillary 70. The bi-directional slide would have two notches 61 cut therein such that, in one embodiment, when a first notch is positioned under a first feed tube, the second notch is positioned over the top of the capillary 70. Similarly, when the slide 60 is then translated to the opposite position where the first notch is positioned over the top of the capillary 70, and thereby releases the solder ball 20 into the capillary 70, the second notch is positioned under the second feed tube to accept another solder ball 20. Through the use of a bi-directional slide, the delivery and reflow rate of the present invention could be substantially increased. Moreover, in another preferred embodiment, the use of a pressurized fluid flowing coaxially with the laser fiber optic 81 and through the capillary 70 as described above, would assist in reducing the time to delivery the indexed solder balls through the capillary 70. This ultimately translates into increased speed of delivery and reflow of the solder material.

Figure 6C:
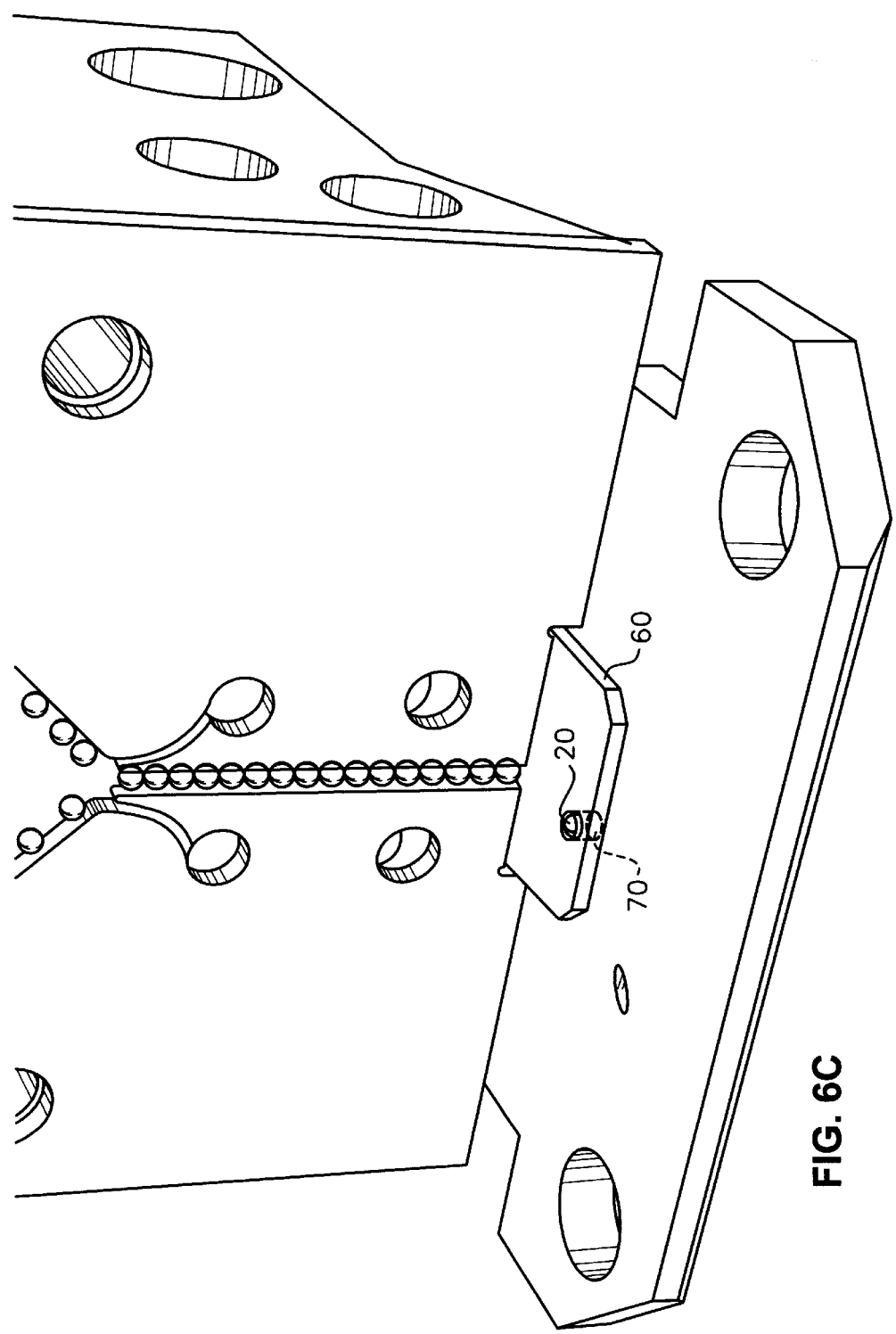

Referring to FIGS. 6A–6C, a third exemplary embodiment of the present invention is illustrated. In FIG. 6A, feeder 600 includes a local reservoir 602, agitation zone 604, pressurized fluid ports 606, ball stacking column 608, and vent port 616. Solder balls 20 are provided from reservoir 40 via feed tube 54 (shown in FIG. 10) to local reservoir 602. In turn, the solder balls flow into agitation zone 604 and circulate or are agitated by the introduction of an inert pressurized fluid, such as nitrogen, through ports 606. The benefit of using an inert gas was described above and will not be repeated. The action of the pressurized fluid also urges solder balls 20 into ball stacking column 608 at a top portion thereof. The solder balls flow through ball stacking column 608 and engage orifice 61 formed in slide 60. The provision of the pressurized fluid at both sides of stacking column 608 has the added benefit of preventing the solder balls from jamming at the entrance of stacking column 608. In order to ensure that the pressurized fluid is able to continuously flow into agitation zone 604, and to balance the flow of fluid into stacking column 608, vent port 616 is provided to allow a portion of the pressurized fluid to escape from agitation zone 604. The width of vent port 616 is less that the diameter of solder balls 20 to prevent a solder ball from escaping from agitation 604 through vent port 616. In a preferred embodiment, the diameter to vent port 616 is between about 30% to 75% of the diameter of solder ball 20, and most preferably about 50% of the diameter of solder ball 20.

Figure 10:
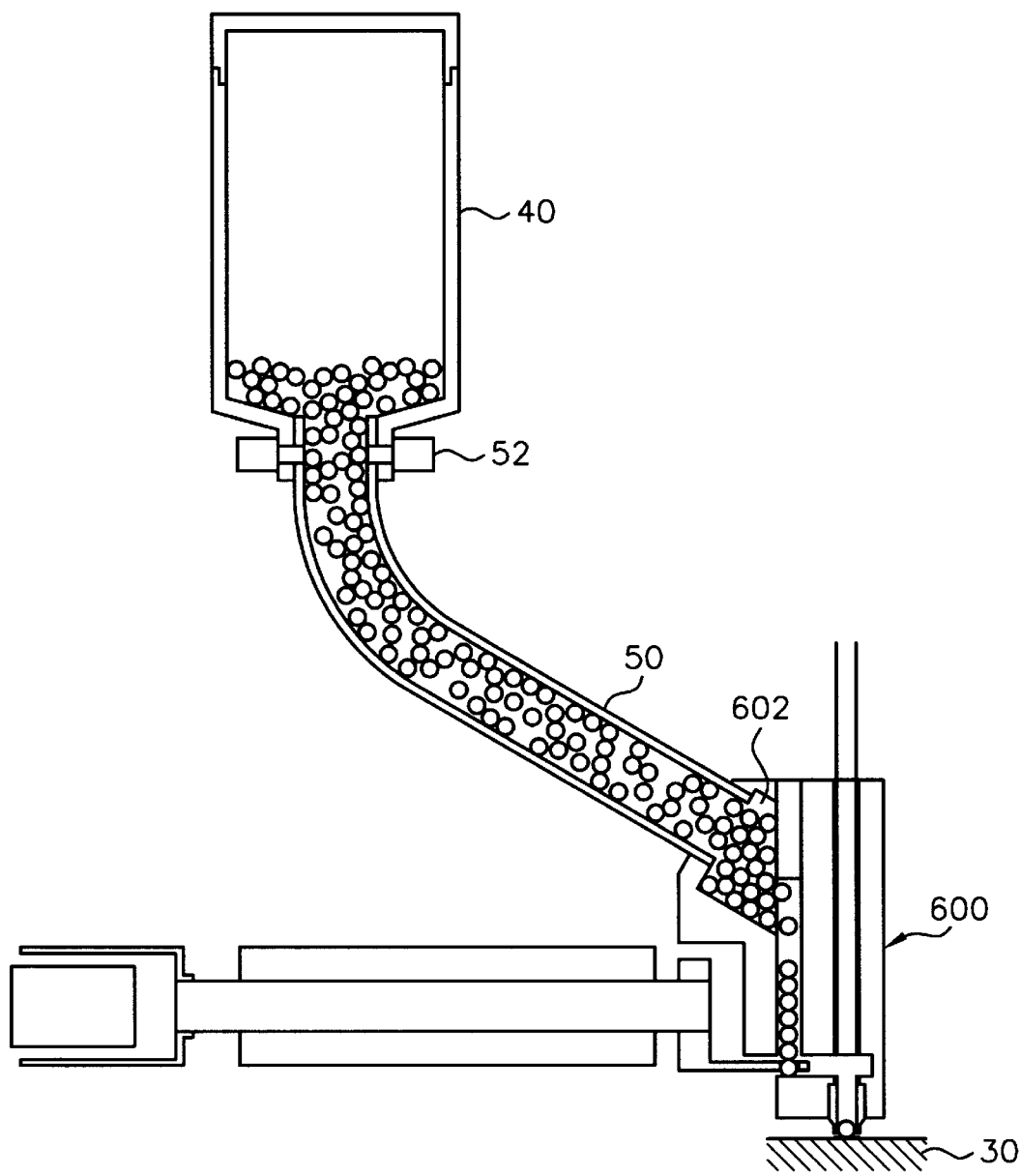
FIG. 10 is a cutaway side view of the third exemplary embodiment of the present invention.

As shown in FIG. 10, in a preferred embodiment, reservoir 40 is stationary and remotely located from the local reservoir 602. As a result, reservoir 40 may be large enough to contain a significant number of solder balls (approximating 5 cubic inches) and not interfere with the operation of the overall bonding apparatus. In addition, feed tube 54 may include a level sensor 52 to determine when the supply of solder balls 20 falls below a predetermined threshold. The sensor may provide a visual and or aural annunciation to the operator, or provide a similar indication to the process controller (not shown). In addition, the feed tube 54 is preferably made from a highly flexible and partially anti-static material, such as Tygon® or latex. This helps prevent solder balls 20 from sticking within feed tube 54. It is also preferable that the internal diameter of feed tube 54 be at least five times the diameter of solder balls 20 to prevent the jamming of the balls within feed tube 54 and to facilitate gravity feeding of the solder balls from reservoir 40 to local reservoir 602.

Figure 7:
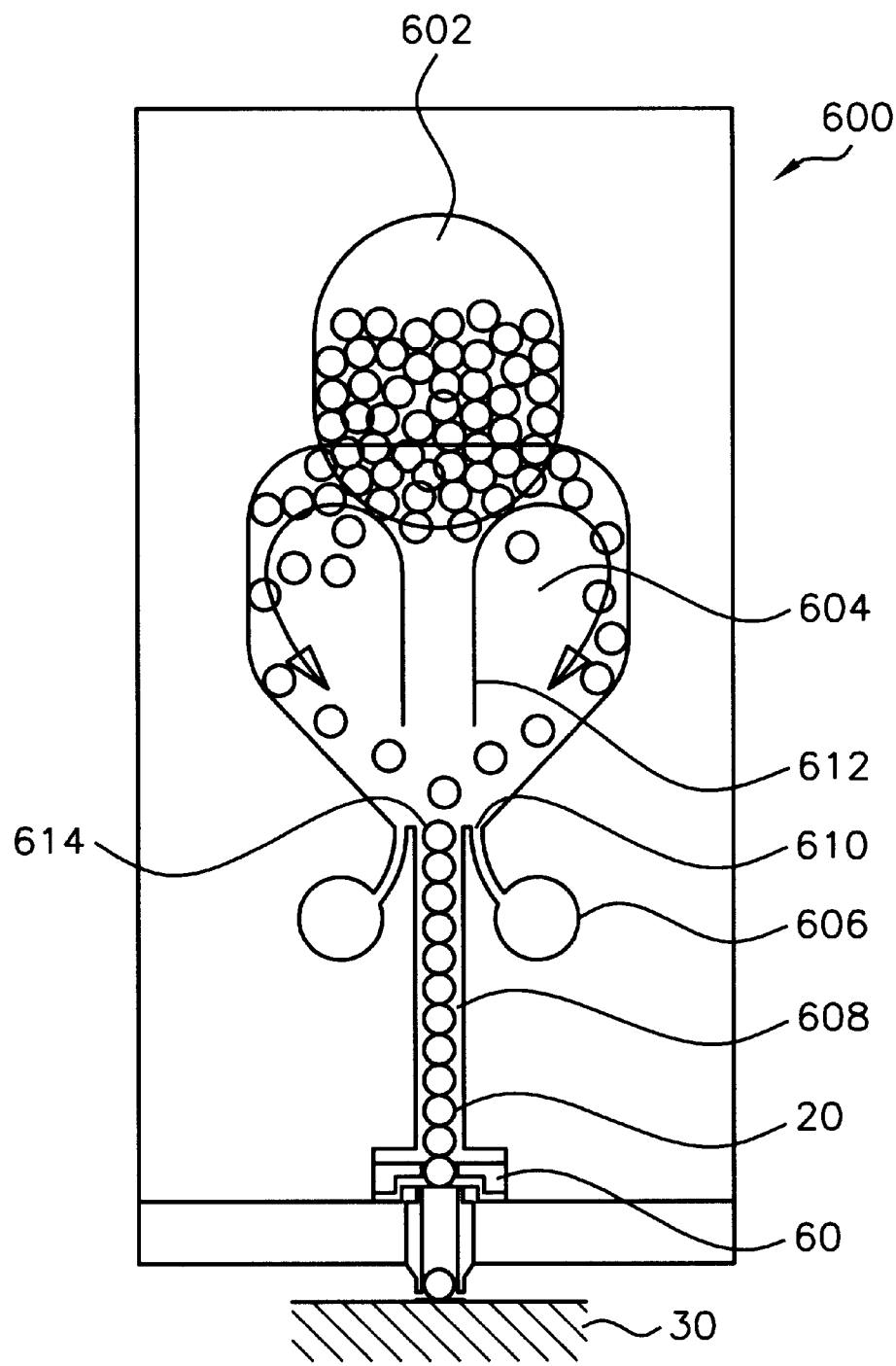
FIG. 7 is an illustrated cutaway side view of the exemplary embodiment shown in FIGS. 6A–6C.

FIG. 7 is a cutaway side view and FIG. 6B is a perspective cutaway view illustrating the agitation of solder balls 20 within agitation zone 604. As shown in FIGS. 6B and 7, pressurized fluid 612 is introduced into agitation zone 604 through outlet ports 610 situated adjacent upper end 614 of ball stacking column 608. In the exemplary embodiment, outlet ports 610 are substantially shaped as a knife edge along side of upper end 614. The action of pressurized fluid 612 circulates or agitates solder balls 20 within agitation zone 604 and urges solder balls 20 in a singular manner into the upper end 614 of ball stacking column 608. The speed at which solder balls 20 are urged into ball stacking column 608 exceeds approximately 200 solder balls per second. In a preferred embodiment, the length of ball stacking column 608 may accommodate about 16 solder balls.

Referring now to FIG. 6C, the movement of solder ball 20 from ball stacking column 608 to capillary 70, by slide plate 60, is illustrated.

Figure 8A:
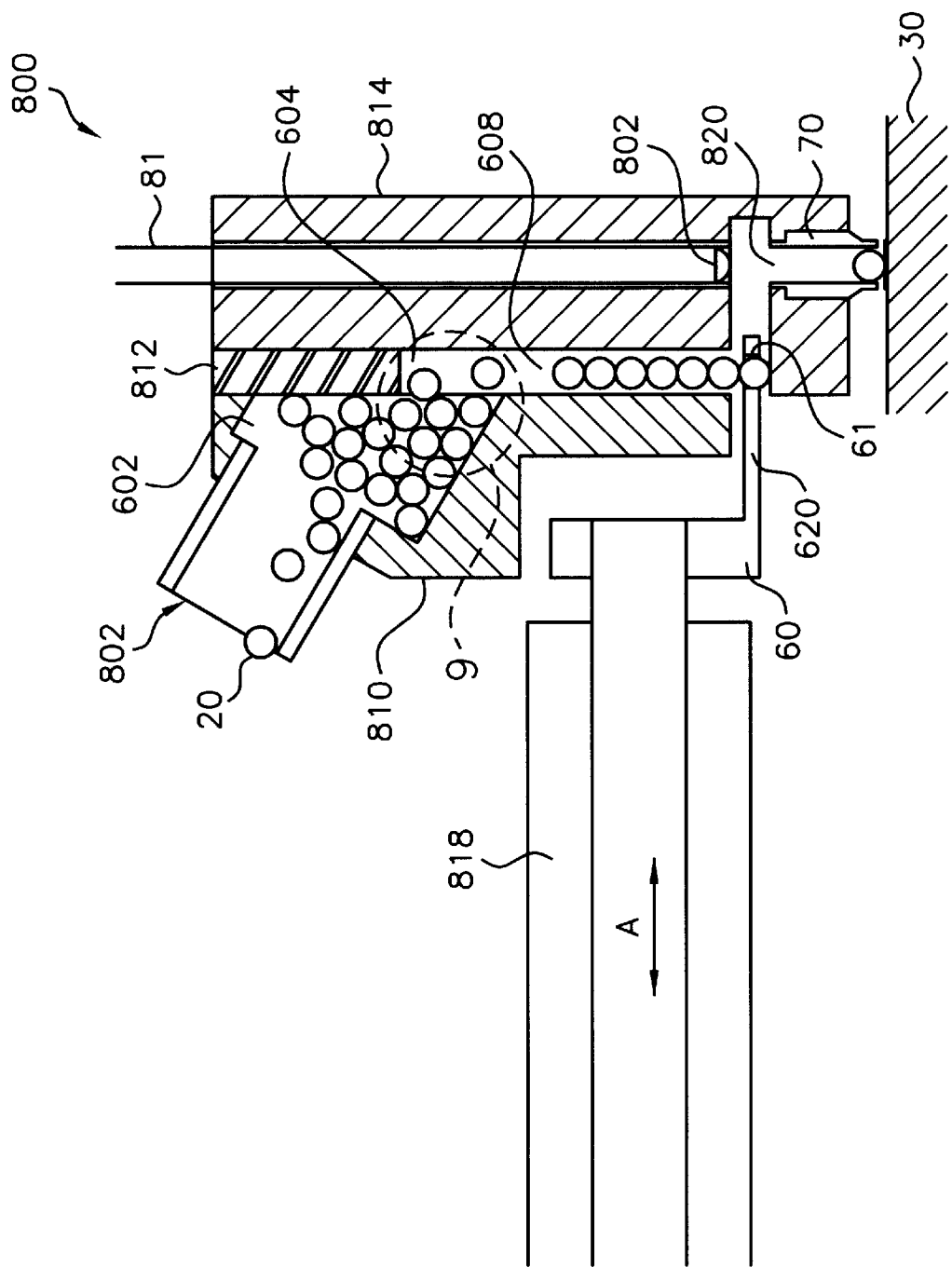
FIG. 8A is an illustrated cutaway side view of a feed head according to another exemplary embodiment of the present invention.
Figure 8B:
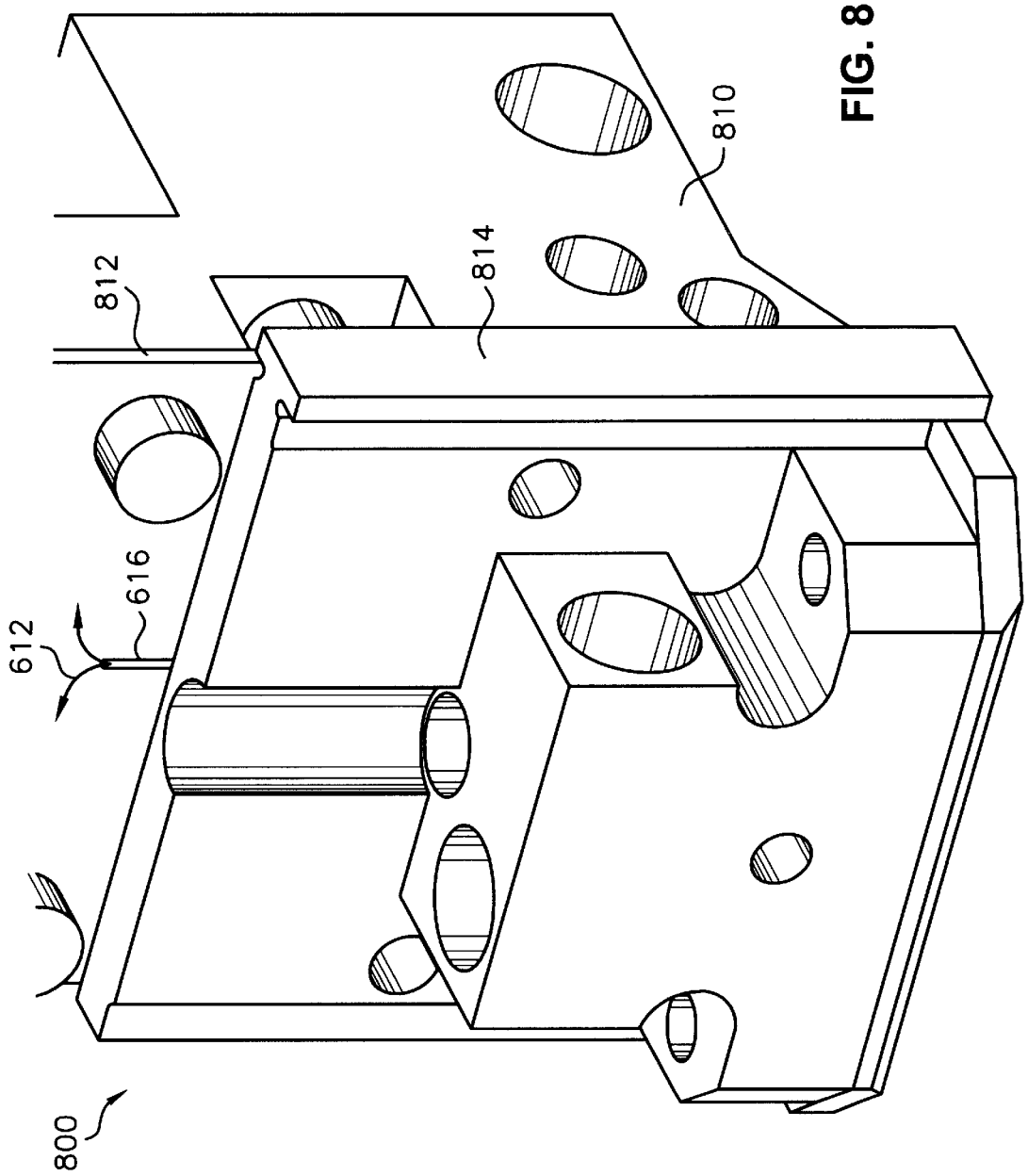
FIG. 8B is a perspective view of the feed head of FIG. 8A.

FIGS. 8A and 8B are a cutaway side view and a perspective view, respectively, of a feed head 800 according to a further exemplary embodiment of the present invention. In FIG. 8A, feed head 800 includes head 810, feed plate 812 and front plate 814. Feed head 810 includes feed tube inlet 802 and local reservoir 602, discussed above. The feed head 810 and front plate 814 are coupled to one another through feed plate 812, forming both agitation zone 604 and ball stacking column 608. In a preferred embodiment, feed plate 812 controls the width of agitation zone 604 and diameter of ball stacking column 608 to be about equal to the diameter of solder ball 20. In a preferred embodiment, the diameter of solder ball 20 is about 0.012±0.0005 inch, and the thickness of feed plate 812 is about 0.0125 inch.

As solder balls 20 are provided to feed head 800 from reservoir 40 via feed tube 54, the solder balls 20 are agitated in agitation zone 604 and urged into stacking column 608 (as discussed in detail above). In turn, the solder balls 20 are conveyed to the upper end 820 of capillary 70 by indexing slide 60. The indexing slide 60 includes plate 602 having an orifice 61 to receive solder ball 20. The solder ball then travels through capillary 70 to rest on the surface of substrate 30. Similar to the first exemplary embodiment, solder ball 20 may be urged through capillary 70 by the inert gas.

Referring again to FIG. 8A, indexing slide 60 travels orthogonal to stacking column 608 under servo control (not shown). In a preferred embodiment, air bearing 818 is coupled to the servo control and provides support for indexing slide 60. As shown in FIG. 8B, a portion of the pressurized fluid 612 is able to vent from agitation zone 604 via vent port 616.

Energy from an energy source, such as a laser (not shown), is coupled to the solder ball 20 via optical fiber 81. In a preferred embodiment, lens 802 is integral with optical fiber 81 and preferably sculptured at the tip of optical fiber 81. This allows for superior focusing of the laser beam on the solder ball 20 and enhances the motion of the feed head by reducing weight attributable to the separate lens used in conventional systems.

Figure 11A:
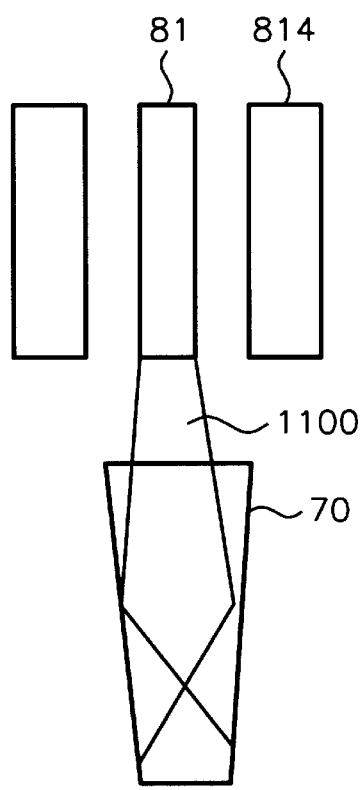
FIG. 11A is a partial side view of a conventional fiber optic coupling.

FIG. 11A illustrates the coupling of laser energy 1100 according to a conventional apparatus. As shown in FIG. 11A, unfocused laser energy 1100 tends to defuse and impact the sidewalls of capillary 70.

Figure 11B:
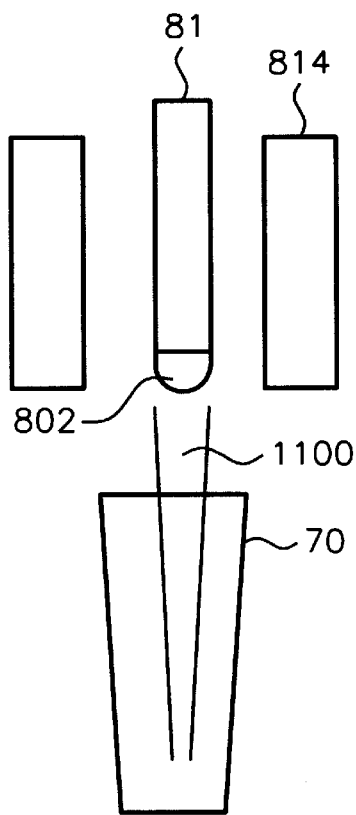
FIG. 11B is a partial side view of a fiber optic coupling according to an exemplary embodiment of the present invention.

FIG. 11B illustrates the benefits of lens 802 formed at the end of optical fiber 81. As shown in FIG. 11B. lens 802 serves to focus laser energy 1100 through the approximate center of capillary 70, allowing greater efficiency and more reliable reflowing of solder material 20.

Figure 9:
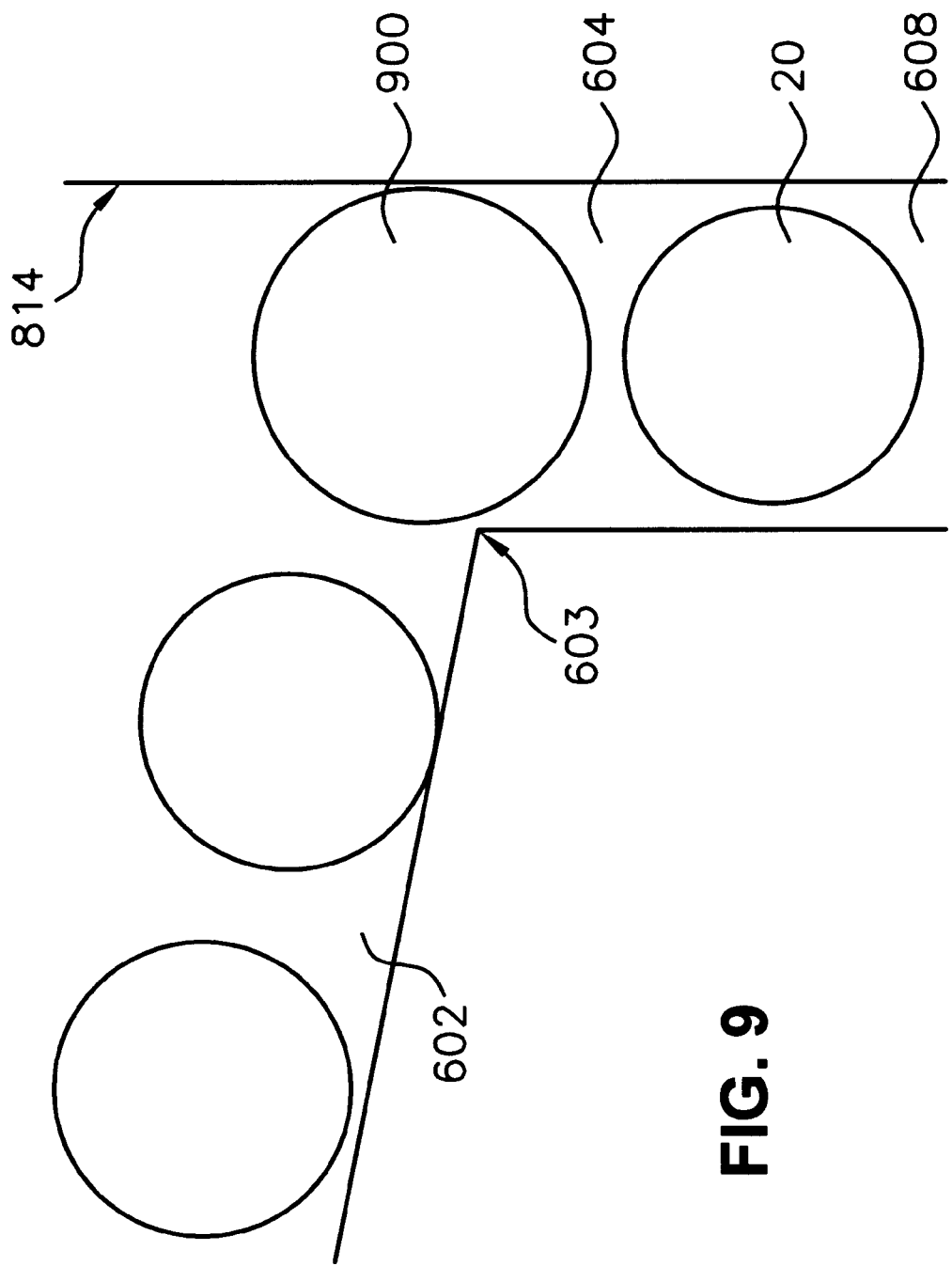
FIG. 9 is a cutaway side view of a portion of the feed head shown in FIGS. 8A–8B.

Referring now to FIG. 9, a detailed sectional view of the local reservoir 602/agitator 604 interface is shown. FIG. 9 illustrates the ability of the exemplary embodiment to prevent oversized solder balls 20 from lodging in ball stacking column 608. In FIG. 9, when an oversized solder ball 900 is urged toward agitation 604, the thickness of feed plate 812 prevents oversized solder ball 900 from fully entering agitation zone 904. Oversized solder ball 900 will remain above agitation zone 814 along ledge 603 of local reservoir 602, while in tolerance solder balls 20 circulate in agitation zone 604. In addition, the action of the pressurized fluid 612 (shown in FIG. 7) will "kick" oversized solder ball 900 away from ledge 603 allowing in tolerance solder balls 20 to continue to be urged into agitation zone 604. Over time, ledge 603 will collect the over sized oversized solder balls 900, allowing the operator to remove them during periodic maintenance operations.

Figure 12:
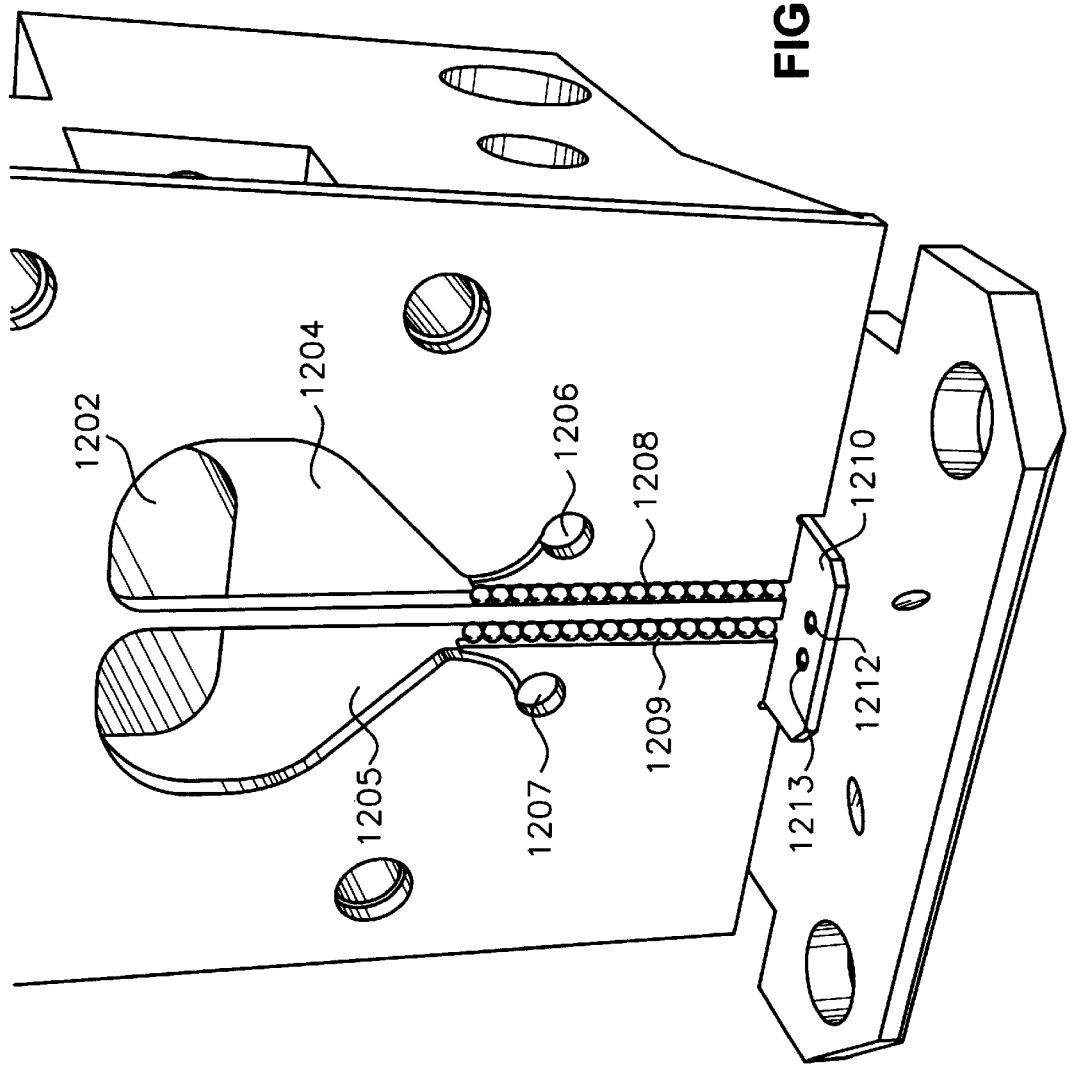
FIG. 12 is a perspective cutaway view of a fourth exemplary embodiment of the present invention.
Figure 13:
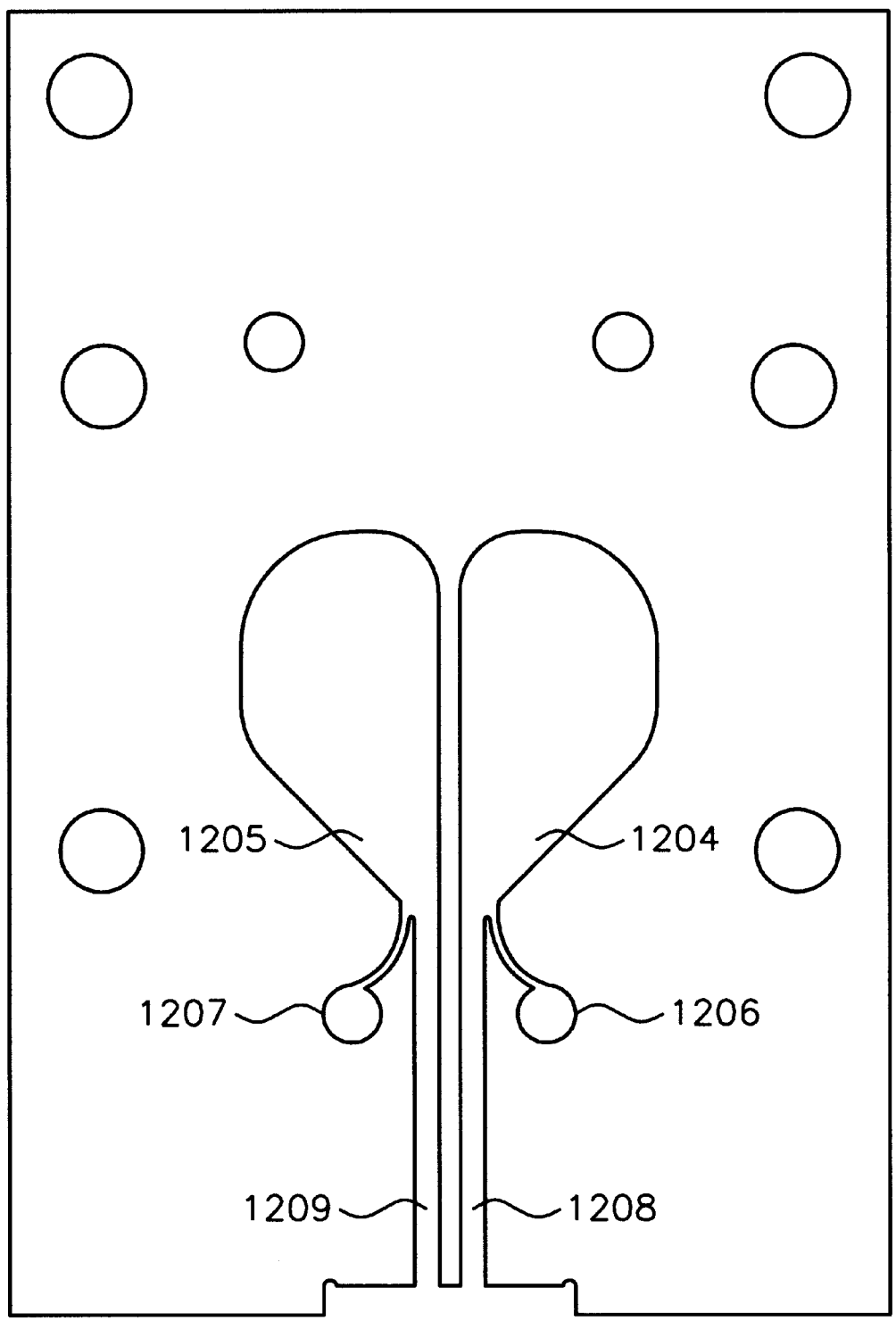
FIG. 13 is an illustrated cutaway side view of the exemplary embodiment shown in FIG. 12.

FIGS. 12 and 13 illustrate a fourth exemplary embodiment of the present invention. In FIGS. 12 and 13, feeder 1200 includes a local reservoir 1202, agitation zones 1204, 1205 pressurized fluid ports 1206, 1207 and ball stacking columns 1208, 1209. This embodiment is similar to the first exemplary embodiment expect for the inclusion of multiple agitation zones coupled to respective ball stacking columns. In addition, slide 1210 (similar to slide 60 in the third exemplary embodiment) includes multiple orifices 1212, 1213, to accommodate balls 20 received from ball stacking columns 1208, 1209, respectively. In all other aspects, the fourth exemplary embodiment is identical to the third exemplary embodiment. Therefore, explanation of the detailed operation will not be repeated.

Figure 14C:
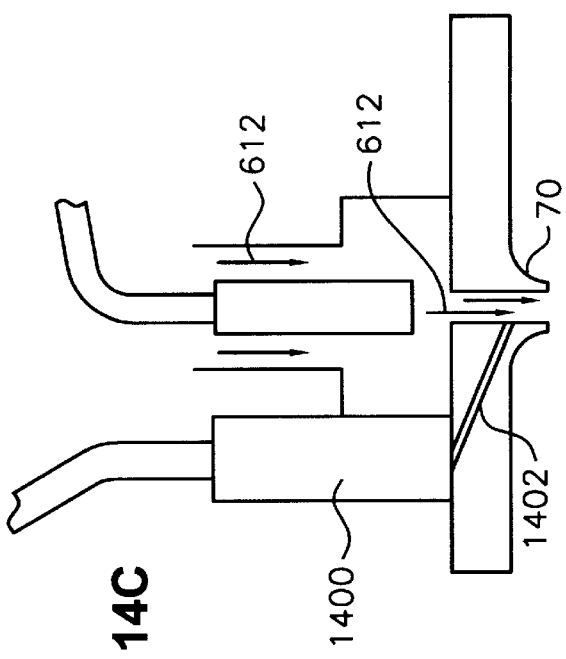
FIGS. 14A–14C are illustrated cutaway side views of a pressure sensor according to an exemplary embodiment of the present invention.
Figure 14A:
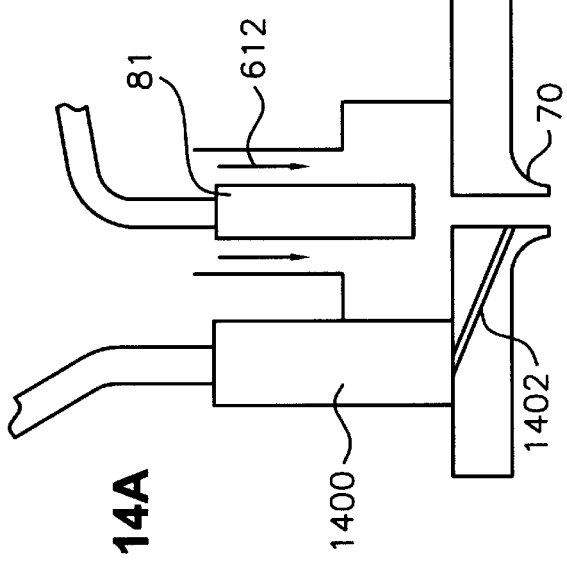

As shown in FIG. 14A, in yet another exemplary embodiment of the present invention, sensor 1400 monitors the pressure of the fluid 612 used to urge solder balls 20 through the capillary 70. Pressure monitor port 1402 creates a path between capillary 70 and pressure sensor 1400. The diameter of port 1402 is preferably between about 30% to 75% of the diameter of capillary 70, and most preferably about 50% of the diameter of capillary 70.

Figure 14B:
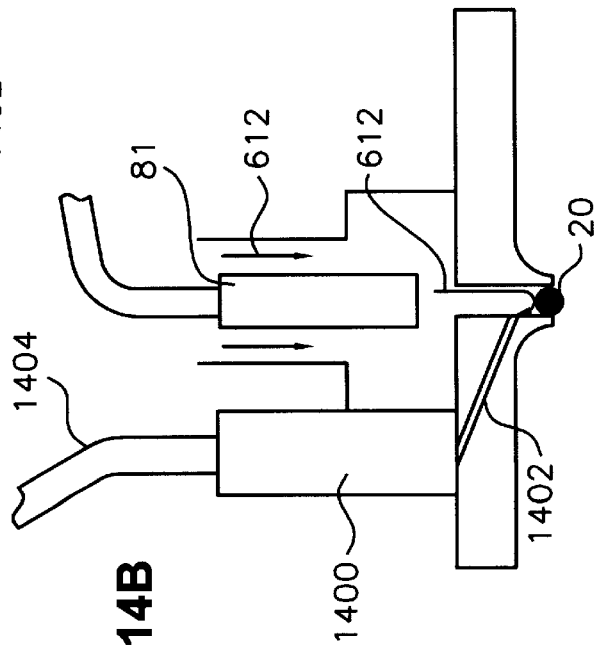

FIG. 14B illustrates the condition created when a solder ball 20 is at the bottom of capillary 70. In this case solder ball 20 substantially obstructs capillary 70 and increases the flow of fluid 612 through port 1402. This increased flow is sensed by sensor 1400 and a signal indicative of the presence of solder ball 20 is output on signal line 1404 to an annunciator or processor (not shown). It is contemplated that a pressure of about 2 PSI or greater indicates the presence of solder ball 20.

FIG. 14C illustrates the condition created when a solder ball 20 is not obstructing the bottom of capillary 70. In this case substantially all of the fluid 612 flows through capillary 70 with little if any fluid 612 flowing through port 1402 resulting in sensor 1400 measuring about 0 PSI. In response, a signal indicative of the absence of solder ball 20 is output on signal line 1404 to the annunciator or processor (not shown).

The pressure sensor provides the added benefit of preventing the supplying of laser energy to the capillary (and ultimately the surface of the substrate 30) if a solder ball 20 is not present. This prevents potential damage to the surface of substrate 30. It is also contemplated that the absence of solder ball 20 for a predetermined period is an indication of either a low solder ball supply or the presence of mostly oversized solder balls in agitation zone 604.

Figure 15:
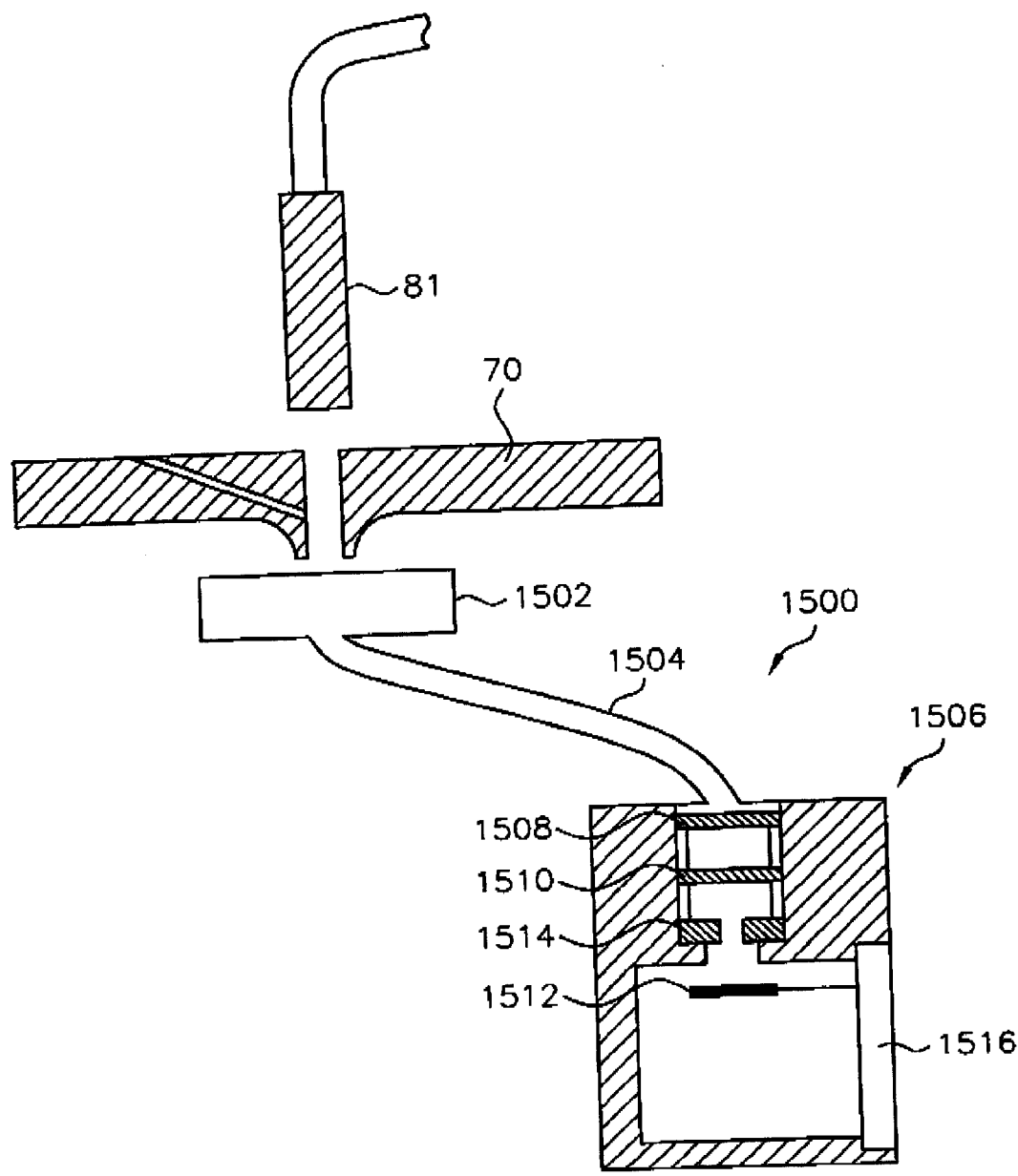
FIG. 15 is an illustrated cutaway side view of a laser energy monitor according to an exemplary embodiment of the present invention.

FIG. 15 is an illustrated cutaway side view of a laser energy monitor according to an exemplary embodiment of the present invention. In FIG. 15, sensor 1500 monitors the laser energy used to reflow solder ball 20 (not shown in this figure). Sensor 1500 includes window 1502, optical fiber 1504, and sensor module 1506 coupled to window 1502 by optical fiber 1504. Window 1502 is preferably formed from a crystal, such as sapphire for example. In the exemplary embodiment, window 1502 is placed below capillary 70 to sample energy from the energy source as the energy is emitted from optical fiber 81.

In a preferred embodiment, a short burst of laser energy is sampled by window 1502 to ensure that the power level output from the laser is correct. The sampled energy is transferred to sensor module 1506 by optical fiber 1504. The energy from optical fiber 1504 is received by a first filter 1508 to preferably filter infrared radiation and absorb heat. The filtered energy is then provided to second filter 1510 to filter out the visible light component of the laser energy. This further filtered energy is provided to sensor 1512 through aperture 1514 to minimize the amount of energy provided to sensor 1512 to avoid potential damage of sensor 1512. Sensor 1512 is coupled to processor 1514 to generate a signal indicative of the energy emitted by the laser.

In the exemplary embodiment, if the energy level of the laser is not within acceptable levels, the level may be adjusted as desired. It is contemplated that the laser may be sampled when the bonding head is positioned away from the substrate. Monitoring laser energy is desired to prevent damage to the substrate 30 attributable to excess laser energy, or improper adhesion of solder ball 20 due to insufficient laser energy. In the exemplary embodiment, sensor 1512 is a photodiode sensor.

As described above, in a preferred embodiment, the capillary 70 may be approximately ten solder ball diameters in length and may have an interior diameter of approximately the same diameter of the solder balls being placed and reflowed to the substrate 30. In a further preferred embodiment, the capillary 70 may be constructed of a carbide material. As manufactured of such material, the capillary interior may be used to direct the laser energy to the solder material positioned on the substrate 30. In such an embodiment, the capillary 70 may be manufactured from a polished tungsten, carbide material to improve reflection of the laser 80. The reflection of the laser energy assists in focussing the energy upon the solder material positioned on the substrate 30 to ensure proper reflow.

In a further embodiment, a computer or data processor (not shown) may be coupled to the delivery and reflow system 10 to automatically control the capillary 70 positioning. Specifically, the computer would control the x-y-z location of the capillary 70 for each of the solder connection points desired to the positioned on the substrate 30. Through the use of such a programmable computer, the pattern of solder ball placement can be easily revised, reconfigured or updated.

The method of operating a high-speed solder ball delivery and reflow system would, in an exemplary embodiment, include the steps as disclosed herein. That is, through the introduction of a pressurized fluid into a reservoir holding solder material, the solder is urged through a feed tube towards a capillary. The second step is to individually index the solder material delivered through the feed tube into a capillary. A third step, also using a pressurized fluid, is to direct the individual solder material indexed to the capillary, through the capillary and onto the substrate surface. Finally, the solder material is reflowed to the substrate by an energy source. As disclosed above for the exemplary embodiments of the apparatus, the energy source may be a laser. After the delivery and reflow of a solder ball to the substrate, the capillary may be repositioned over the substrate to a new location to delivery and reflow another solder ball. The x-y position control of the capillary may be accomplished by reading successive data locations from a computer memory.

Although the invention has been described with reference to exemplary embodiments, it is not limited thereto. It is intended to be and understood that the following appended claims should be construed to include other variants and embodiments of the invention which may be made by those skilled in the art as being within the true spirit and scope of the present invention.

What is claimed is:

1. An apparatus for use with an energy source for delivering and reflowing solder material onto a substrate, comprising:
   a first reservoir to hold the solder material;
   a second reservoir;
   a flexible feed tube coupled between the first reservoir and the second reservoir for directing a portion of the solder material from the first reservoir to the second reservoir;
   a capillary for guiding the solder material to the substrate; and
   indexing means coupled between the second reservoir and the capillary to individually index the solder material from the second reservoir into the capillary.

2. The apparatus according to claim 1, wherein the second reservoir comprises:
   an input port for receiving the solder material from the feed tube,
   an agitator coupled to the input port for agitating the solder material, and
   an output port coupled to the agitator for receiving the agitated solder material.

3. The apparatus according to claim 2, wherein the second reservoir further comprises fluid ports for introducing a pressurized fluid into the agitator, the pressurized fluid agitating the solder material within the agitator and urging the solder material into the output port.

4. The apparatus according to claim 3, wherein the output port is adjacent to and between the fluid ports, and wherein fluid flow from the fluid ports prevents the solder material from jamming at an upper portion of the output port.

5. The apparatus according to claim 3, wherein the pressurized fluid is an inert gas to maintain the solder material in a nonoxidizing environment.

6. The apparatus according to claim 5, wherein the inert gas is nitrogen.

7. The apparatus according to claim 5, wherein the pressurized fluid is also provided to the first reservoir to maintain the solder material in the nonoxidizing environment.

8. The apparatus according to claim 2, wherein the agitated solder material is received by the output port at a rate of at least 200 pieces of solder material per second.

9. The apparatus according to claim 1, wherein the energy source is a laser.

10. The apparatus according to claim 1, further comprising an optical fiber to couple energy from the energy source to reflow the solder material onto the substrate.

11. The apparatus according to claim 10, wherein the optical fiber is coupled to the capillary.

12. The apparatus according to claim 10, wherein an end of the optical fiber is coupled to a lens to focus the energy onto the solder material.

13. The apparatus according to claim 12, wherein the lens is unitary with and formed from the optical fiber.

14. The apparatus according to claim 10, further comprising sensing means to sense an energy level of the energy source.

15. The apparatus according to claim 14, wherein the sensing means is coupled to the energy source by a further optical fiber.

16. The apparatus according to claim 1, further comprising sensing means to determine a level of the solder material in the feed tube.

17. The apparatus according to claim 16, wherein the sensing means is an optical sensor.

18. The apparatus according to claim 16, wherein the sensing means is coupled to the feed tube at an upper portion thereof.

19. The apparatus according to claim 1, wherein the solder material is substantially shaped as balls.

20. The apparatus according to claim 19, wherein the indexing and reflowing of the solder balls is at least approximately 40 balls each second.

21. The apparatus according to claim 1, wherein the energy source uses the capillary to focus the reflowing energy onto the solder.

22. The apparatus according to claim 1, wherein the capillary is made of an alumina or polished tungsten carbide material.

23. The apparatus according to claim 1, further comprising means to reposition the capillary to a new location on the substrate to deliver and reflow the solder material.

24. The apparatus according to claim 23, wherein the first reservoir is stationary and separated from the second reservoir.

25. The apparatus according to claim 24, wherein the second reservoir is fixedly coupled to the capillary.

26. The apparatus according to claim 24, further comprising means to prevent solder material having a size greater than a predetermined size from entering the indexing means.

27. An apparatus for use with an energy source for delivering and reflowing solder material onto a substrate, comprising:
   a reservoir to hold the solder material;
   a capillary for guiding the solder material to the substrate;
   a flexible feed tube coupled to the reservoir for directing the solder material from the reservoir to the capillary;
   indexing means coupled between the feed tube and the capillary to individually index the solder material from the feed tube into the capillary; and
   delivery means to deliver the solder material from the reservoir, through (a) the feed tube, (b) the indexing means, (c) the capillary and onto the substrate.

28. A solder delivery and reflow apparatus for use with an energy source for delivering and reflowing solder balls onto a substrate, the apparatus comprising:
   a stationary reservoir containing the solder balls;
   a repositionable reservoir coupled to the fixed reservoir to receive the solder balls;
   a capillary for directing individual solder balls from the repositionable reservoir onto the substrate;
   a feed tube for guiding the solder balls from the repositionable reservoir to the capillary;
   indexing means to individually move solder balls from the feed tube to the capillary;
   delivery means to deliver the solder balls through the feed tube, through the indexing means, through the capillary and onto the substrate at a first location; and
   repositioning means to reposition the capillary to a further location on the substrate to deliver another solder ball.

29. The apparatus according to claim 28, wherein the indexing means is a translating slide mechanism.

30. The apparatus according to claim 28, wherein the delivery means is a pressurized fluid introduced into the repositionable reservoir to urge the solder material through (a) the indexing means, (b) the capillary, and to the substrate.

31. The apparatus according to claim 30, further comprising sensing means to sense a presence of the solder ball in the capillary.

32. The apparatus according to claim 31, wherein the sensing means includes a pressure sensor coupled to the capillary via an orifice, the orifice providing at least a portion of the pressurized fluid to the pressure sensor.

33. The apparatus according to claim 32, wherein the presence of the solder balls is indicated by a pressure of about 2 psi at the pressure sensor.

34. An apparatus for use with an energy source for delivering and reflowing solder material onto a substrate, the apparatus comprising:

a first reservoir to hold the solder material;

a second reservoir;

a flexible feed tube coupled between the first reservoir and the second reservoir for directing a portion of the solder material from the first reservoir to the second reservoir;

a plurality of capillaries for guiding the solder material to the substrate; and indexing means coupled between the second reservoir and the plurality of capillaries to individually index ones of the solder material from the second reservoir into respective ones of the plurality of capillaries.

35. The apparatus according to claim 34, wherein the second reservoir comprises:

an input port for receiving the solder material from the feed tube;

an agitator coupled to the input port for agitating the solder material; and a plurality of output ports coupled to the agitator for receiving the agitated solder material.

* * * * *